United States Patent
Lee et al.

(10) Patent No.: US 12,019,367 B2
(45) Date of Patent: Jun. 25, 2024

(54) MASK BLANKS AND METHODS FOR DEPOSITING LAYERS ON MASK BLANK

(71) Applicant: TAIWAN SEMICONDUCTOR MANUFACTURING COMPANY, LTD., Hsinchu (TW)

(72) Inventors: Hsin-Chang Lee, Zhubei (TW); Pei-Cheng Hsu, Taipei (TW); Ta-Cheng Lien, Cyonglin Township (TW); Wen-Chang Hsueh, Longtan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/084,301

(22) Filed: Dec. 19, 2022

(65) Prior Publication Data

US 2023/0121303 A1    Apr. 20, 2023

Related U.S. Application Data

(63) Continuation of application No. 17/083,348, filed on Oct. 29, 2020, now Pat. No. 11,531,262.

(60) Provisional application No. 62/955,391, filed on Dec. 30, 2019.

(51) Int. Cl.
   *G03F 1/24* (2012.01)
   *G03F 1/48* (2012.01)
   *G03F 1/54* (2012.01)

(52) U.S. Cl.
   CPC ............. *G03F 1/24* (2013.01); *G03F 1/48* (2013.01); *G03F 1/54* (2013.01)

(58) Field of Classification Search
   CPC ............... G03F 1/24; G03F 1/48; G03F 1/54
   USPC .............................................................. 430/5
   See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 2021/0041781 A1 | 2/2021 | Xiao et al. |

FOREIGN PATENT DOCUMENTS

| | | |
|---|---|---|
| CN | 101010631 A | 8/2007 |
| TW | 201830122 A | 8/2018 |
| TW | 201918788 A | 5/2019 |
| WO | 2016/162157 A1 | 10/2016 |

OTHER PUBLICATIONS

Non-Final Office Action issued in U.S. Appl. No. 17/083,348, dated Apr. 19, 2022.

Notice of Allowance issued in U.S. Appl. No. 17/083,348, dated Aug. 16, 2022.

*Primary Examiner* — Christopher G Young
(74) *Attorney, Agent, or Firm* — STUDEBAKER & BRACKETT PC

(57) ABSTRACT

A reflective mask blank includes a substrate, a reflective multilayer (RML) disposed on the substrate, a capping layer disposed on the reflective multilayer, and an absorber layer disposed on the capping layer. The absorber layer has length or width dimensions smaller than the capping layer, and part of the capping layer is exposed by the absorber layer. The dimension of the absorber layer and the hard mask layer ranges between 146 cm to 148 cm. The dimensions of the substrate, the RML, and the capping layer range between 150 cm to 152 cm.

20 Claims, 14 Drawing Sheets

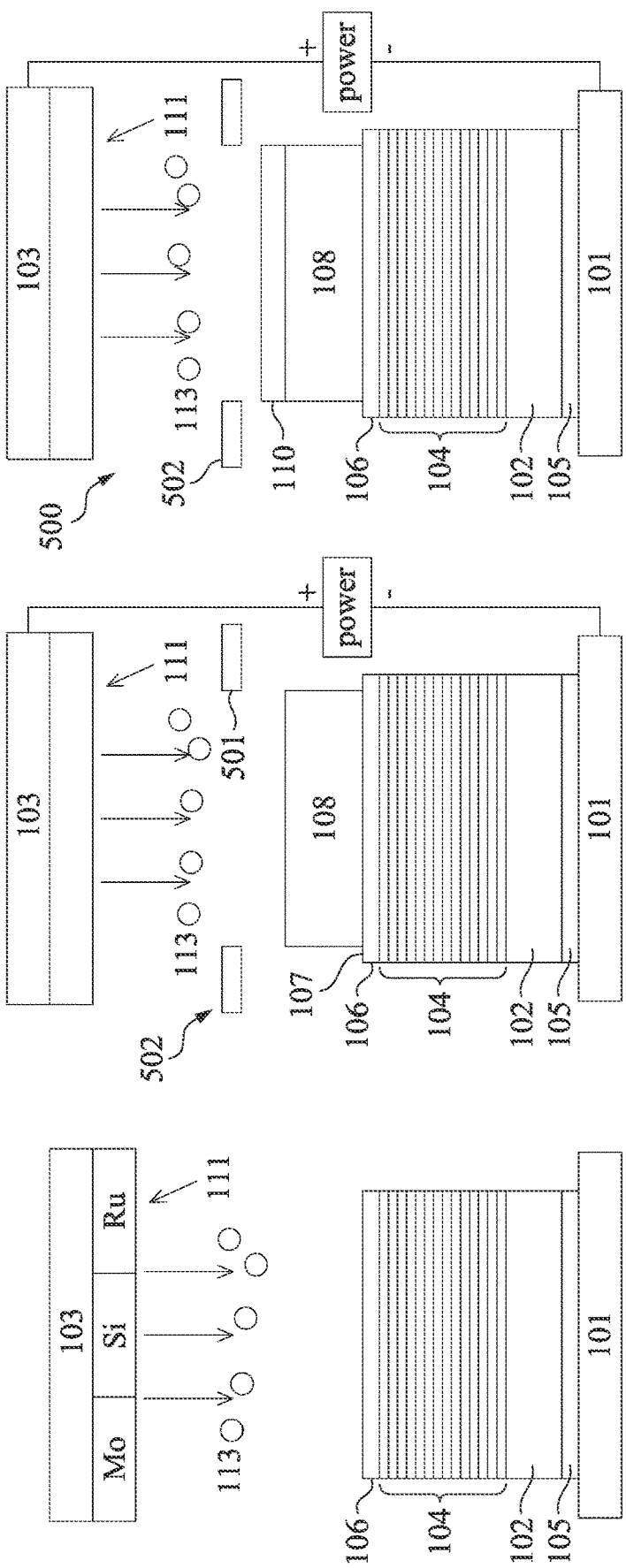

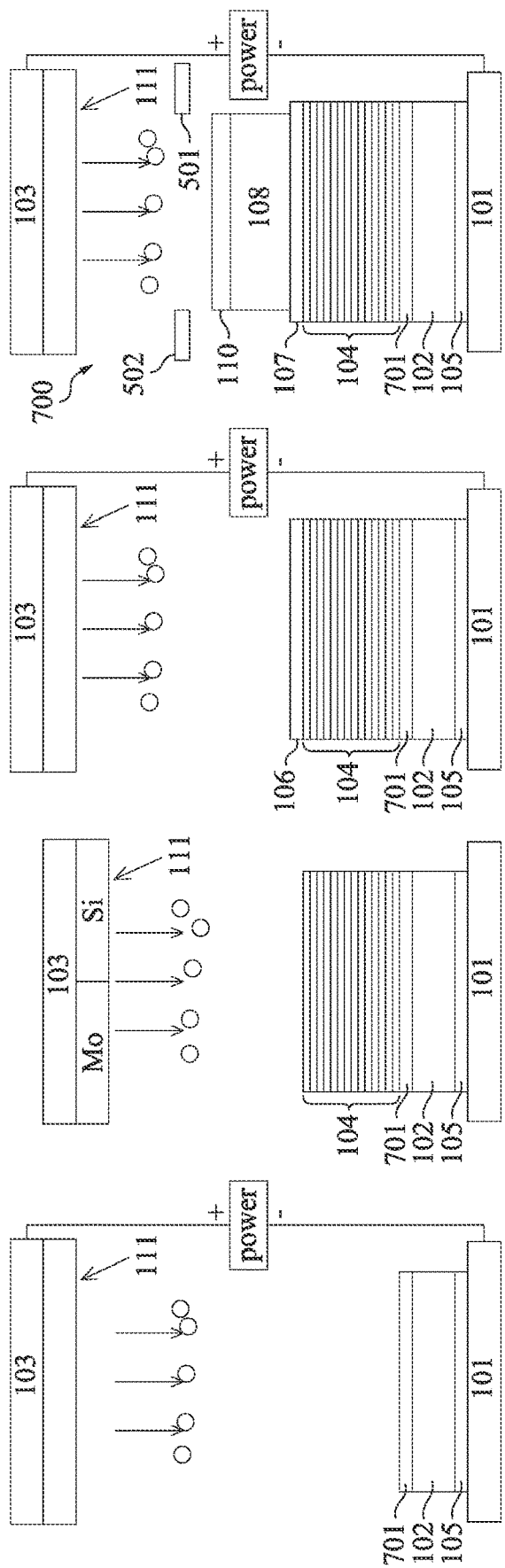

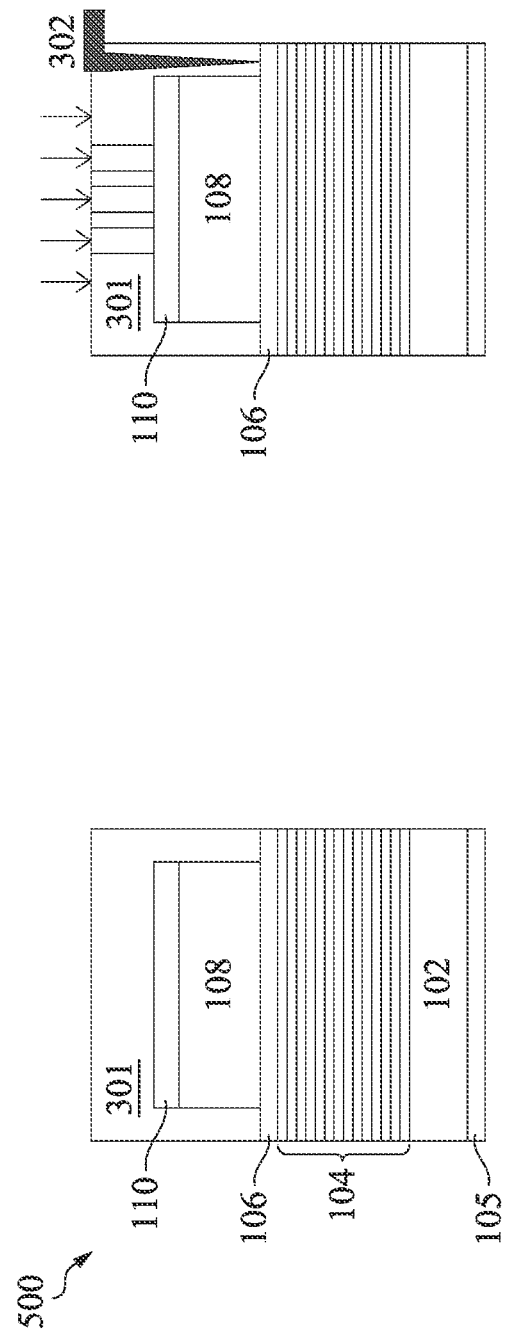
FIG. 10A
FIG. 10B
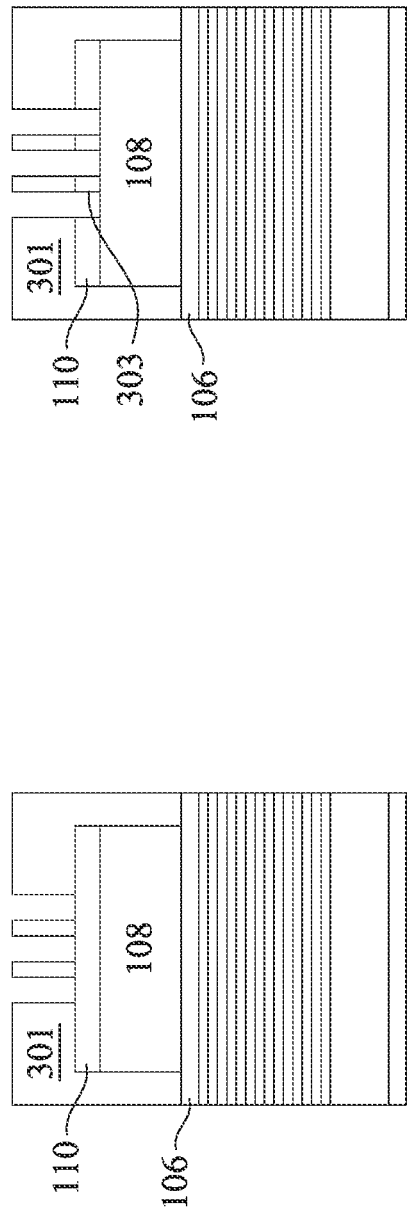
FIG. 10C
FIG. 10D

MASK BLANKS AND METHODS FOR DEPOSITING LAYERS ON MASK BLANK

CROSS-REFERENCE TO RELATED APPLICATIONS

This non-provisional application is a continuation of U.S. patent application Ser. No. 17/083,348, filed Oct. 29, 2020, now U.S. Pat. No. 11,531,262, which claims priority to U.S. Provisional Patent Application 62/955,391, filed Dec. 30, 2019, the entire disclosures of which are incorporated herein by reference.

BACKGROUND

The wavelength of radiation used for lithography in semiconductor manufacturing has decreased from ultraviolet to deep ultraviolet (DUV) and, more recently to extreme ultraviolet (EUV). Further decreases in component size require further improvements in the resolution of lithography which are achievable using extreme ultraviolet lithography (EUVL). EUVL employs radiation having a wavelength of about 1-100 nm, e.g., 13.5 nm. Since a projection lens type exposure apparatus cannot be used in an EUV lithography, an all-reflective optical system is required in EUV lithography. Accordingly, an EUV reflective structure (reflector, such as a mirror) having a high reflectance is used in the EUV lithography. A reflective mask is used during EUV lithography process to form an integrated circuit having smaller feature size.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 5A, 5B, and 5C illustrate operations in manufacturing an extreme ultraviolet (EUV) reflective mask blank, according to embodiments of the disclosure.

FIGS. 7A, 7B, 7C, and 7D illustrate operations in manufacturing an extreme ultraviolet (EUV) reflective mask blank including a protection layer, according to embodiments of the disclosure.

FIGS. 10A, 10B, 10C, 10D, 10E, 10F, 10G, and 10H illustrates operations for manufacturing an extreme ultraviolet (EUV) reflective mask for fabricating semiconductor devices using the mask blank of FIG. 5C, according to embodiments disclosed.

DETAILED DESCRIPTION

Figure 1:
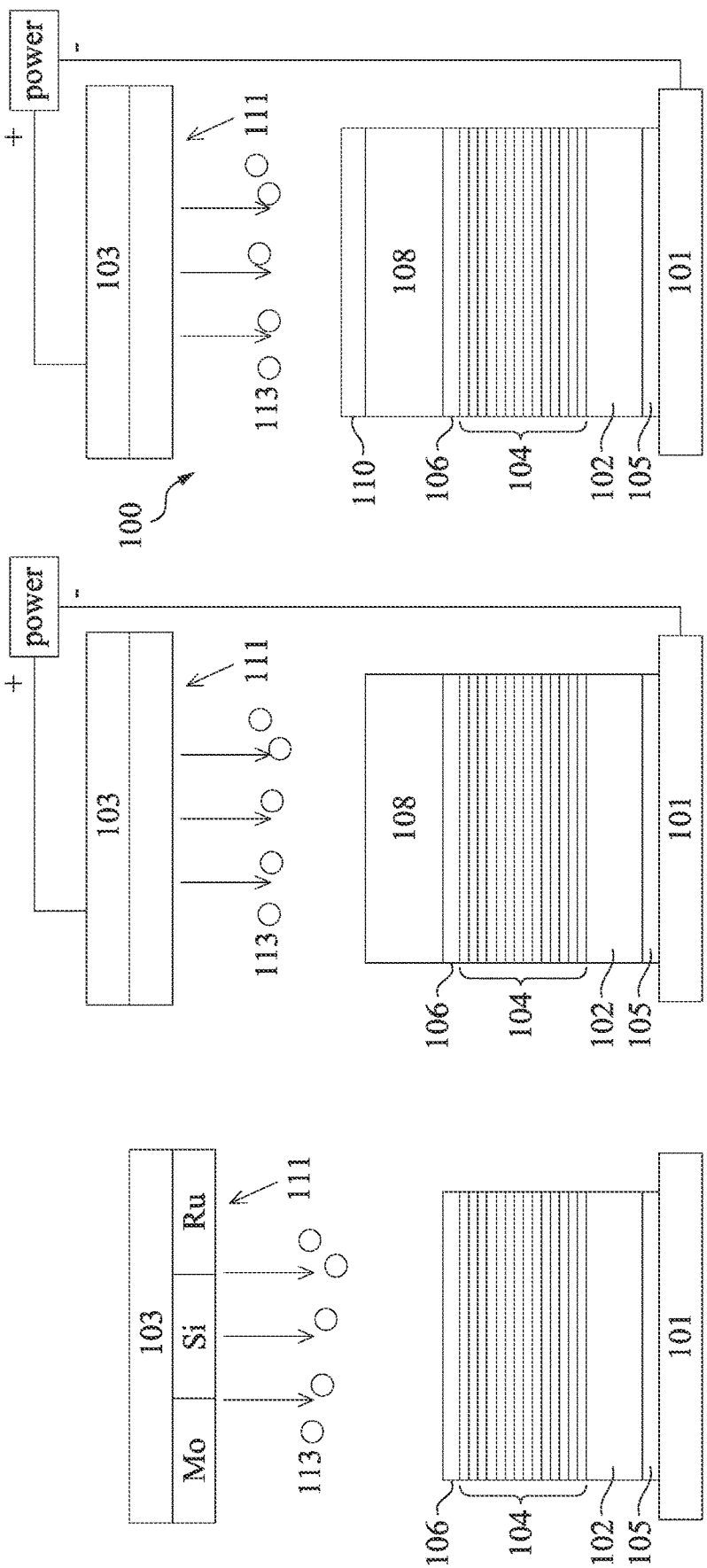
FIGS. 1A, 1B, and 1C illustrate operations in manufacturing an extreme ultraviolet (EUV) mask blank.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

FIGS. 1A, 1B, and 1C illustrate operations in manufacturing an extreme ultraviolet (EUV) reflective mask blank 100. A mask blank is a stacked member to be used for fabrication of a photomask, which has not been patterned yet. The mask blank 100 is patterned to obtain a mask (e.g., a reflective photomask, also referred to as a reflective reticle or reflective mask) that is used to fabricate semiconductor devices using a lithography exposing tool (e.g., an extreme ultraviolet (EUV) lithography exposing tool).

The EUV reflective mask blank is manufactured using ion beam deposition (IBD) or ion beam sputtering (IBS) processes for sequentially forming different layers of the EUV reflective mask blank 100 on a substrate 102. The ion beam deposition (IBD) or ion beam sputtering (IBS) processes are performed under vacuum condition using a deposition apparatus.

When forming the different layers using ion beam deposition, the substrate 102 is positioned on a first electrode 101, e.g., cathode. The substrate 102 is chosen to minimize image distortion due to mask heating by the intensified illumination radiation. In some embodiments, the substrate 102 includes a low thermal expansion material (LTEM). The LTEM includes fused quartz, silicon carbide, silicon oxide-titanium oxide alloy and/or other suitable LTEM known in the art. Alternatively, the substrate 102 includes other materials, such as quartz or glass, depending on design requirements of the mask. The substrate 102 includes materials with a low defect level and a smooth surface. In some embodiments, the size (length×breadth) of the substrate 102 and the different layers formed on the substrate 102 is in a range between 150 cm to 152 cm. In some embodiments, the size (length× breadth) of the substrate 102 and the different layers formed on the substrate 102 is 152 cm×152 cm. In other embodiments, the size of the substrate 102 and the different layers formed on the substrate 102 is 150 cm×150 cm.

The EUV reflective mask blank 100 includes a reflective multilayer (RML) 104 deposited on the substrate 102. The reflective multilayer 104 is designed to reflect the radiation light directed to the substrate 102. In one embodiment, the reflective multilayer 104 includes alternating layers of two materials deposited on the top of the substrate 102 to act as a Bragg reflector that maximizes the reflection of the radiation light, such as EUV with 13.5 nm wavelength. The combination of the two materials in the alternating layers is selected to provide a large difference in refractive indices between the two layers (for example, to achieve large reflectivity at an interface of the two layers according to Fresnel equations), yet provide small extinction coefficients for the layers (for example, to minimize absorption).

One or more targets including different materials for the reflective multilayer 104 to be deposited over the substrate 102 form a second electrode 103, e.g., anode, that is positioned over the substrate 102. An ion source included in the deposition apparatus creates an ion beam 111. The ion source is a high frequency (HF) ion source, however, also other types of ion sources can also be used. In order to generate the ion beam, a desired sputter gas is provided to the ion source and is ionized inside the ion source by atomic collisions with electrons that are accelerated by an inductively coupled electromagnetic field. The generated ions comprise the ion beam 111 and are focused towards the target, i.e. the second electrode 103. The ions in the ion beam 111 hit one of the target material of the second electrode 103 which comprises the different materials (e.g., Mo, Si, and Ru) for the reflective multilayer 104. The collision between the ions in the ion beam 111 and the material comprising the second electrode 103 generates target atoms. This process of sputtering or vaporizing the target is referred to as the sputter process. The deposition apparatus is equipped with a plurality of different targets (second electrodes 103) for generating the different target atoms for forming the different layers of the reflective multilayer 104. Thus, the sputter process can be changed to another target without the need to interrupt the vacuum. In some embodiments, the ion beam moves from one target to another or the target moves so that the ion beam hits different materials. At least a portion of the sputtered ions 113 emerge from the second electrode 103 in direction of the substrate 102. The sputtered ions 113 hit the substrate 102 to form a layer of the material of the second electrode 103 on the substrate 102.

The layers of the reflective multilayer 104 are alternately deposited on the substrate 102. In some embodiments, and as illustrated, the reflective multilayer 104 includes molybdenum-silicon (Mo/Si) layer pairs formed by bombarding Mo and Si targets as the second electrode 103. In other embodiments, the reflective multilayer 104 includes molybdenum-beryllium (Mo/Be) layer pairs formed by bombarding Mo and Be targets. A thickness of each layer of each layer pair of the reflective multilayer 104 is adjusted depending on a wavelength and an angle of incidence of light (such as extreme ultraviolet (EUV) radiation) incident on the EUV reflective mask, such that the mask achieves maximum constructive interference of light reflected from different interfaces of the reflective multilayer 104. In general, reflectivity of the reflective multilayer 104 increases as a number of layer pairs of the reflective multilayer increases. Accordingly, in principle, if the number of layer pairs is sufficiently large and extinction coefficients of the materials of the layers are close to zero, the reflectivity of the reflective multilayer 104 can approach 100% regardless of the difference of the refractive indices of the materials of the layers in the layer pairs. However, in the EUV wavelength range, the highest reflectivity that can be achieved is limited by the extinction coefficients of the materials employed for the layers of the reflective multilayer 104. In some embodiments, the number of layer pairs of the reflective multilayer 104 ranges from twenty to eighty. In certain embodiments, to achieve more than 90% of the maximum achievable reflectivity (with the chosen materials) of the reflective multilayer 104 and minimize mask blank manufacturing time and costs, the reflective multilayer 104 includes about forty layer pairs, such as forty Mo/Si pairs. In some embodiments, the Mo/Si pairs includes silicon layer having a thickness of 3 nm to 5 nm (for example, about 4 nm), and a molybdenum layer having a thickness of 2 nm to 4 nm (for example, about 3 nm). In certain embodiments, the reflective multilayer 104 includes about 40 Mo/Si film pairs, and each Mo/Si film pair has a collective thickness of about 7 nm. Alternatively, the reflective multilayer 104 includes any other number of layer pairs, depending on reflectivity specifications for the mask.

A capping layer 106 is deposited on the reflective multilayer 104 by bombarding a corresponding target comprised of the second electrode 103. Because the capping layer 106 has different etching characteristics from an absorber layer, the capping layer 106 provides protection to the reflective multilayer 104. At the same time, the capping layer limits degradation of the EUV reflectivity from the reflective multilayer 104. In some embodiments, and as illustrated, the capping layer 106 is made of ruthenium Ru (or a Ru alloy) that is deposited using a corresponding Ru target. In some embodiments, the capping layer 106 includes an alloy of ruthenium and a suitable metal "M" (RuM alloy), in which the metal "M" is highly oxygen unreactive. In some embodiments, the RuM alloy of the capping layer 106 is in an amorphous structure. In some examples, the capping layer 106 includes an alloy of Ru and platinum (Pt) (RuPt alloy). In some embodiments, the metal "M" of RuM alloy is one of Po, Hg, Os, Rh, Pd, Ir, Nb, Pt, Zr, V, Mn, Ta or a combination thereof. The thickness of the capping layer 106 ranges between about 2 nm and about 5 nm in some embodiments.

In some embodiments, the capping layer 106 is made of Si. In some embodiments, a Si layer is formed on the reflective multilayer 104. In other embodiments, the topmost layer of the reflective multilayer 104 is a Si layer having a thickness larger than the thickness of the other Si layers of the reflective multilayer 104. In some embodiments, the top Si layer has a thickness in a range from about 5 nm to about 15 nm.

Referring to FIG. 1B, the EUV reflective mask blank 100 includes an absorber layer 108 formed on the capping layer 106. The absorber layer 108 is deposited on the capping layer 106 by bombarding a corresponding target comprised of the second electrode 103. The absorber layer 108 is designed to absorb radiation (such as EUV light) during a lithography exposing process. During lithography, the radiation passes through the openings in the absorber layer 108 when the mask blank 100 is patterned for forming the photomask and is reflected by the reflective multilayer 104. Thus, the circuit pattern defined by the photomask is imaged to a photo resist layer formed over a substrate. In some embodiments, the absorber layer 108 includes tantalum boron nitride (TaBN). In certain embodiments, the absorber layer 108 includes a first layer made of TaBN and a second layer made of TaBO formed on the first layer. In some embodiments, the second layer has a smaller thickness than the first layer. In other embodiments, the absorber layer 108 includes chromium (Cr), chromium oxide (CrO), chromium nitride (CrN), titanium nitride (TiN), tantalum nitride (TaN), tantalum (Ta), TaHf, TaGe, $HfO_2$, Ni, NiO, TaCo, TaCoO, tantalum and silicon-based materials (e.g., TaSiON, TaBSi), tantalum boron oxide-based materials (e.g., TaBO), titanium (Ti), or aluminum-copper (Al—Cu), palladium, aluminum oxide (AlO), molybdenum (Mo), and other suitable materials. In yet another embodiment, the absorber layer 108 includes multiple layers. In some embodiments, the absorber layer 108 is deposited by a deposition technique, such as sputter deposition, CVD, PVD, or ALD, and is patterned by a suitable procedure, such as electron-beam lithography process and etching.

Referring to FIG. 1C, the EUV reflective mask blank 100 includes a hard mask layer 110 formed on the absorber layer 108. The hard mask layer 110 is deposited on the absorber layer 108 by bombarding a corresponding target comprised of the second electrode 103. The hard mask layer 110 includes chromium oxynitride (CrON). In other embodiments, the hard mask layer 110 includes chromium nitride (CrN) or TaBO. The hard mask layer 110 is formed by chemical vapor deposition (CVD), or physical vapor deposition (PVD) including sputtering. The hard mask layer 110 may have a thickness in a range of about 5 nm-10 nm.

In some embodiments, a backside coating layer 105 is deposited on the backside surface of the substrate 102 opposite to the front surface. The backside coating layer 105 is used to fix the mask for photolithographic operation by electrostatic chucking in some embodiments. In an embodiment, the backside coating layer 105 is formed of a compound including chromium nitride or any suitable material for electrostatic chucking of the mask.

Figure 2:
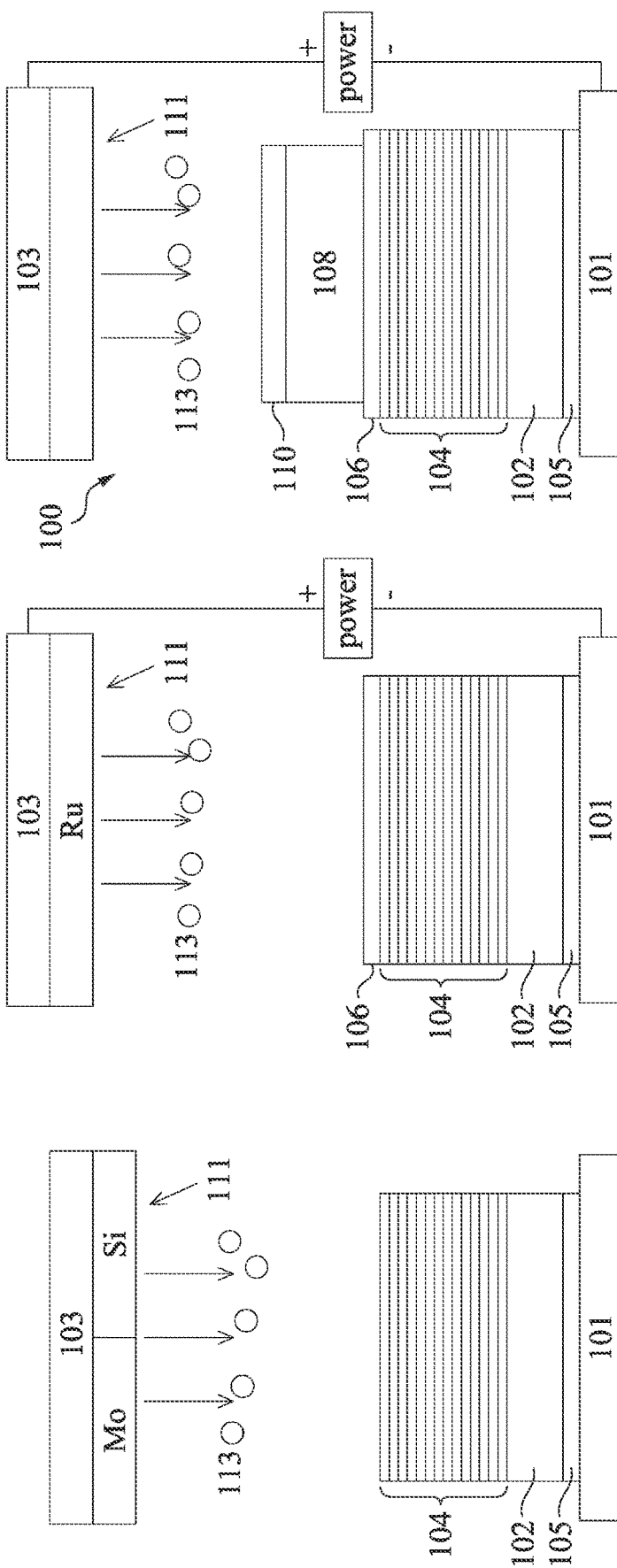
FIGS. 2A, 2B, and 2C illustrate operations in a different manufacturing process of an extreme ultraviolet (EUV) mask blank.

FIGS. 2A, 2B, and 2C illustrate operations in a manufacturing process of the mask blank 100 used in a lithography exposing tool (e.g., an extreme ultraviolet (EUV) lithography exposing tool). As illustrated, in FIG. 2A, the reflective multilayer (RML) 104 deposited on the substrate 102 using ion beam deposition techniques, similar to the process discussed with reference to FIG. 1A.

Referring to FIG. 2B, the capping layer 106 is deposited on the reflective multilayer 104 by a sputtering process. Referring to FIG. 2C, the absorber layer 108 is formed on the capping layer 106, and the hard mask layer 110 is formed on the absorber layer 108. The absorber layer 108 and the hard mask layer 110 are each formed by sputtering. Different from FIG. 1A, in FIGS. 2A and 2B, the target includes two materials for the multilayer stack 104, and then the target is changed (e.g., disposed in a different chamber) for the capping layer.

To fabricate circuit patterns on the mask blank as manufactured above, a resist is formed on the mask blank 100. In forming the photomask, the mask blank 100, more specifically, the absorber layer 108, is patterned through the resist to define a circuit pattern on the absorber layer 108, such as according to an IC design layout. Patterning is performed using electron-beam (e-beam) lithography (also referred to as electron-beam (e-beam) writing). The resist is sensitive to electrons and the electron beam changes the solubility of the resist, enabling selective removal of either the exposed or non-exposed regions of the resist by immersing it in a solvent. During a lithography exposing process, the radiation (such as EUV light) incident on the photomask passes through the openings of the absorber layer 108 and is reflected by the reflective multilayer 104. The circuit pattern is thus imaged to a photo resist layer formed over a substrate.

Figure 3:
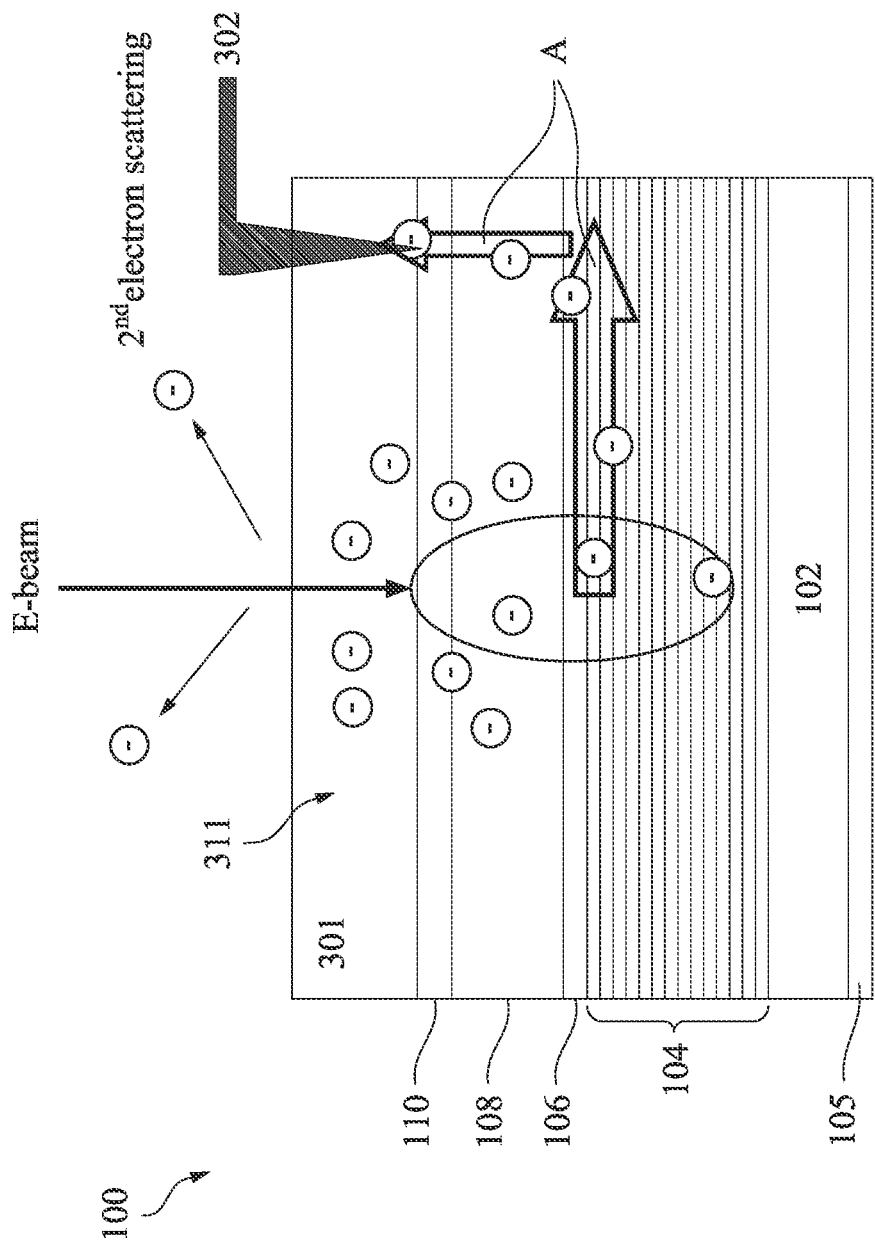
FIG. 3 schematically illustrates the electron-beam (e-beam) lithography process performed on the mask blank of FIG. 1C or 2C.

A secondary electron scattering effect is observed during the electron-beam (e-beam) lithography process in which secondary electrons are generated in the mask blank 100. FIG. 3 schematically illustrates the electron-beam (e-beam) lithography process performed on mask blank 100 and the secondary electrons 311 generated as a result. The generation of the secondary electrons 311 increases the surface voltage of the mask blank 100. The second electron scattering also reduces contrast and resolution of the mask blank 100. In addition, the second electron scattering results in poor critical dimension (CD) uniformity.

In order to reduce the surface voltage, a grounding pin (also referred to as a de-charging pin) 302 is contacted with the outermost layer of the mask blank 100 to reduce the secondary electrons 311 in the mask blank 100. For example, the grounding pin 302 is contacted with the hard mask layer 110 passing through a photoresist layer 301. The flow of the secondary electrons 311 to the grounding pin 302 is indicated by the arrows A. However, the hard mask layer 110 may not have sufficient conductivity, and, as a result, the reduction in the secondary electrons 311 may be limited.

Patterning of the absorber layer 108 is also performed using a plasma etching process. The plasma etching results in a non-uniform voltage increases in the mask blank 100. In plasma etching, a high-speed stream of plasma of an appropriate gas mixture is shot (in pulses) at a target (mask blank 100, in this case). The plasma source, known as the etch species, can be either charged (ions) or neutral (atoms and radicals). During the process, the plasma generates volatile etch products at room temperature from the chemical reactions between the elements of the material etched and the reactive species generated by the plasma. Eventually the atoms of the plasma embed themselves at or just below the surface of the target, thus modifying the physical properties of the target.

Figure 4:
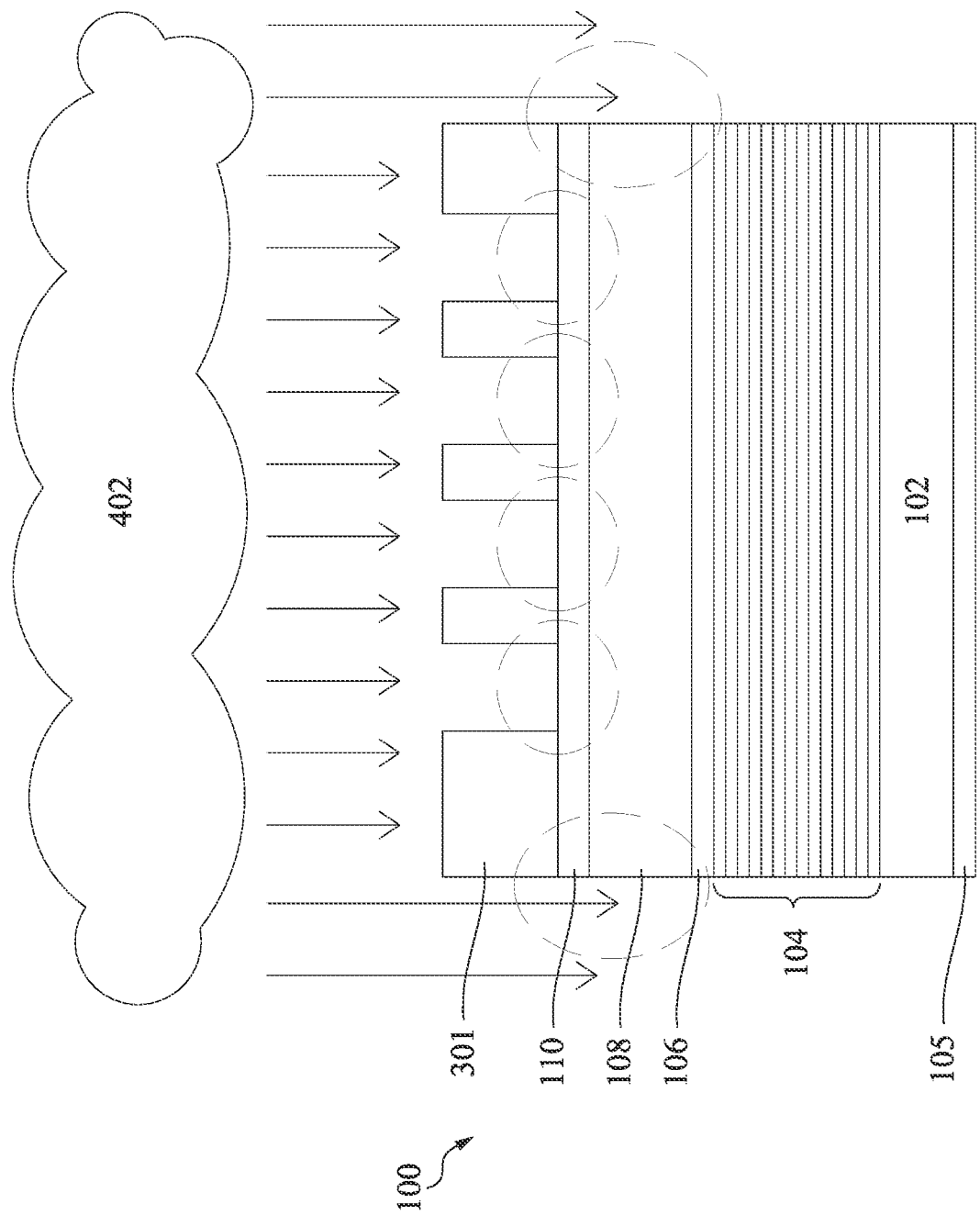
FIG. 4 schematically illustrates a plasma etching process in which the mask blank of FIG. 1C or 2C is exposed to plasma.

FIG. 4 schematically illustrates a plasma etching process wherein the mask blank 100 is exposed to plasma 402. As indicated by the dashed circles, the sidewalls of the absorber layer 108 and the hard mask layer 110, in addition to the surface of the mask blank 100, are exposed to the plasma 402. This causes non-uniform voltage distribution in the absorber layer 108 and the hard mask layer 110, and this results in reduced critical dimension (CD) uniformity.

Embodiments of the disclosure are directed to reducing the deposition area of each of the hard mask and absorber layers in the mask blank. According to embodiments, the deposition area of the hard mask layer and absorber layer are 148 cm×148 cm. In other embodiments, the deposition area of the hard mask layer and absorber layer are 146 cm×146 cm. In still other embodiments, the deposition area of the hard mask layer and absorber layer are 147 cm×147 cm. Reducing the deposition areas, exposes the capping layer. The grounding pin can be contacted with the capping layer to reduce the surface voltage of the mask. Because the capping layer is a relatively good conductor, the surface voltage can be reduced more effectively. Reducing the surface voltage provides for better critical dimension (CD) uniformity.

FIGS. 5A, 5B, and 5C illustrate operations in manufacturing an extreme ultraviolet (EUV) reflective mask blank 500, according to embodiments of the disclosure. The operations for manufacturing the mask blank 500 are similar in some respects to operations for manufacturing the mask blank 100 in FIGS. 1A, 1B, and 1C, and therefore may be best understood with reference thereto where like numerals designate like components not described again in detail. The mask blank 500 is further patterned to obtain a photomask (or reticle) for use in fabricating semiconductor devices using a lithography exposing tool (e.g., an extreme ultraviolet (EUV) lithography exposing tool). As illustrated, the mask blank 500 includes the substrate 102 including a low thermal expansion material (LTEM) and reflective multilayer (RML) 104 deposited on the substrate 102 using a sputtering process, as discussed above. The reflective multilayer 104 is designed to reflect the radiation light directed to the substrate 102. The capping layer 106 is deposited on the reflective multilayer 104 using the sputtering process. The backside coating layer 105 is deposited on the backside surface of the substrate 102 opposite the front surface. Each of the substrate 102, the reflective multilayer 104, the capping layer 106, and the backside coating layer 105 has size (length×breadth) ranging between 150 cm to 152 cm. In some embodiments, each of the substrate 102, the reflective multilayer 104, the capping layer 106, and the backside coating layer 105 has size (length×breadth) of 152 cm×152 cm or 150 cm×150 cm.

Prior to forming the absorber layer 108, a shielding plate 502 is positioned over the assembly including the substrate 102, the reflective multilayer 104, the capping layer 106, and the backside coating layer 105. The shielding plate 502 is sized or shaped (or otherwise configured) such that the absorber layer 108 is formed having length or width dimensions smaller than each of the substrate 102, the reflective multilayer 104, the capping layer 106, and the backside coating layer 105.

Figure 5D:
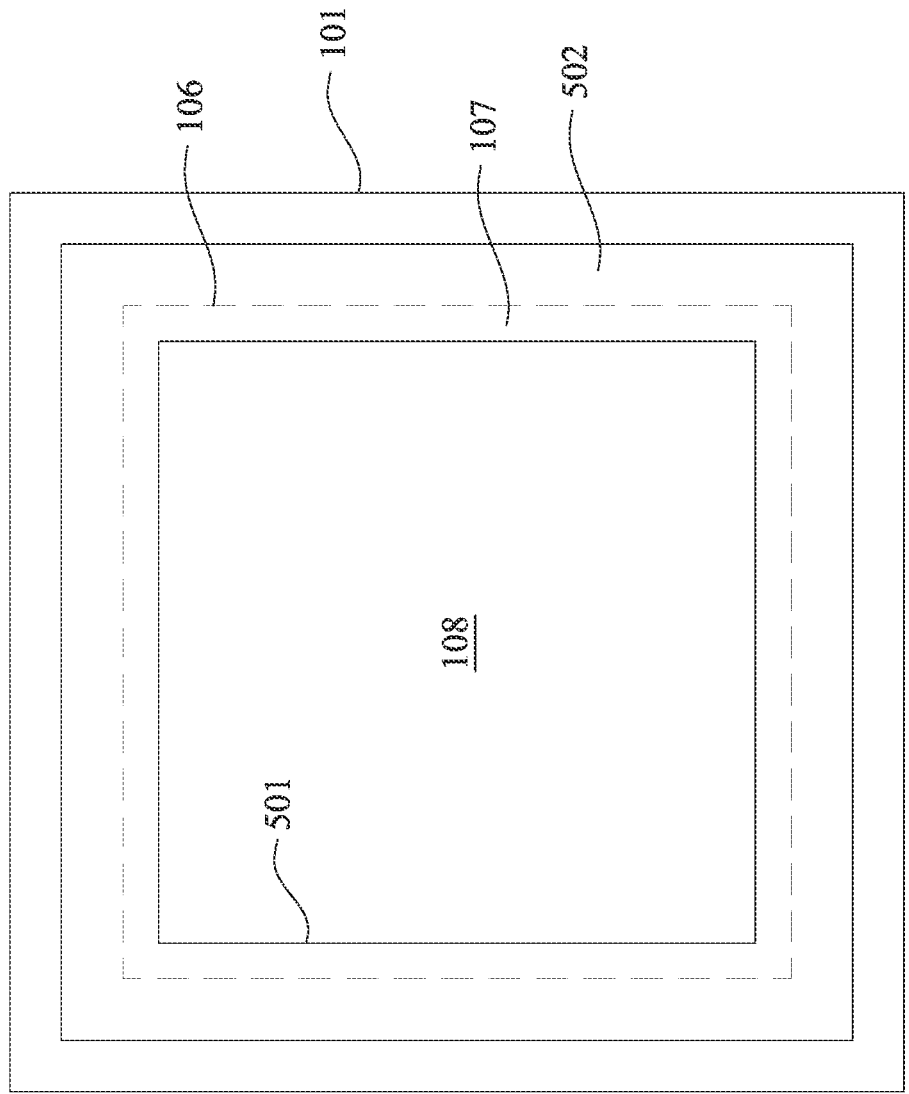
FIG. 5D shows a schematic view of a shielding plate according to an embodiment of the present disclosure.

FIG. 5D is a plan view illustrating the shielding plate 502 positioned over the assembly including the substrate 102, the reflective multilayer 104, the capping layer 106, and the backside coating layer 105. As illustrated, the shielding plate 502 has a frame shape having an opening 501, and the shielding plate 502 is positioned overlapping the substrate 102, the reflective multilayer 104, the capping layer 106, and the backside coating layer 105. The shielding plate 502 is positioned such that the absorber layer 108 and the hard mask layer 110 are formed having desired thicknesses and do not contact the shielding plate 502 when formed. In other embodiments, the shielding plate 502 is ring or annular shaped or can have any desired shape that can expose peripheral region 107 of the capping layer 106, as discussed further below. The opening 501 is sized or shaped such that the absorber layer 108 is formed having length or width dimensions smaller than each of the substrate 102, the reflective multilayer 104, the capping layer 106, and the backside coating layer 105. In other words, the shielding plate 502 limits the area of the capping layer 106 on which the material forming the absorber layer 108 is deposited during the sputtering process. As illustrated, the absorber layer 108 is deposited such that the peripheral region 107 of the capping layer 106 are exposed. In some embodiments, an entire periphery of the capping layer 106 is exposed. In an alternative embodiment, an entire periphery of the capping layer 106 is not exposed and, instead, a portion of the peripheral region 107 is exposed while the remaining peripheral region 107 of the capping layer 106 is covered with the absorber layer 108. The size of the exposed peripheral region 107 or of the exposed portions is such that the grounding pin 302 can be contacted with the capping layer 106, as discussed below. In some embodiments, the shielding plate 502 includes a ceramic material, e.g., quartz or other types of ceramics. However, any other suitable material can be used for the shielding plate 502.

In embodiments, the opening 501 of the shielding plate 502 is sized such that the absorber layer 108 is formed having dimensions (length×breadth) in a range between 146 cm to 148 cm. In some embodiments, the opening 501 of the shielding plate 502 is sized such that the absorber layer 108 is formed having dimensions (length×breadth) 148×148 cm. In other embodiments, the opening 501 of the shielding plate 502 is sized such that the absorber layer 108 is formed having dimensions 146 cm×146 cm. In still other embodiments, the opening 501 of the shielding plate 502 is sized such that the absorber layer 108 is formed having dimensions 147 cm×147 cm.

The shielding plate 502 is also used for forming the hard mask layer 110 so that the hard mask layer 110 is formed having length or width dimensions smaller than each of the substrate 102, the reflective multilayer 104, the capping layer 106, and the backside coating layer 105. The dimensions of the hard mask layer 110 are the same or substantially similar (+/−0.5 cm) as those of the absorber layer 108. In some embodiments, the hard mask layer 110 is formed having dimensions 148 cm×148 cm. In other embodiments, the hard mask layer 110 is formed having dimensions 146 cm×146 cm. In still other embodiments, the hard mask layer 110 is formed having dimensions 147 cm×147 cm. As illustrated, the hard mask layer 110 also exposes peripheral portions of the capping layer 106. In some embodiments, similar to FIG. 1A or 2A, the second electrode 103 includes two different material target for the absorber layer and the hard mask layer. In such a case, it is not necessary to move the shielding plate 502 relative to the substrate and thus the absorber layer and the hard mask layer are formed with well-aligned each other. Although the dimensions of the absorber layer 108 and the hard mask layer 110 are indicated to range between 146 cm to 148 cm, embodiments are not limited in this regard. The dimensions of the absorber layer 108 and the hard mask layer 110 can be increased or decreased as required by application and design requirements, depending on the designing limitations of the processing equipment (e.g., scanners) and as long as an adequate portion of the capping layer 106 is exposed for connecting the grounding pin 302 (see FIG. 8).

Figures 6A, 6B, 6C:
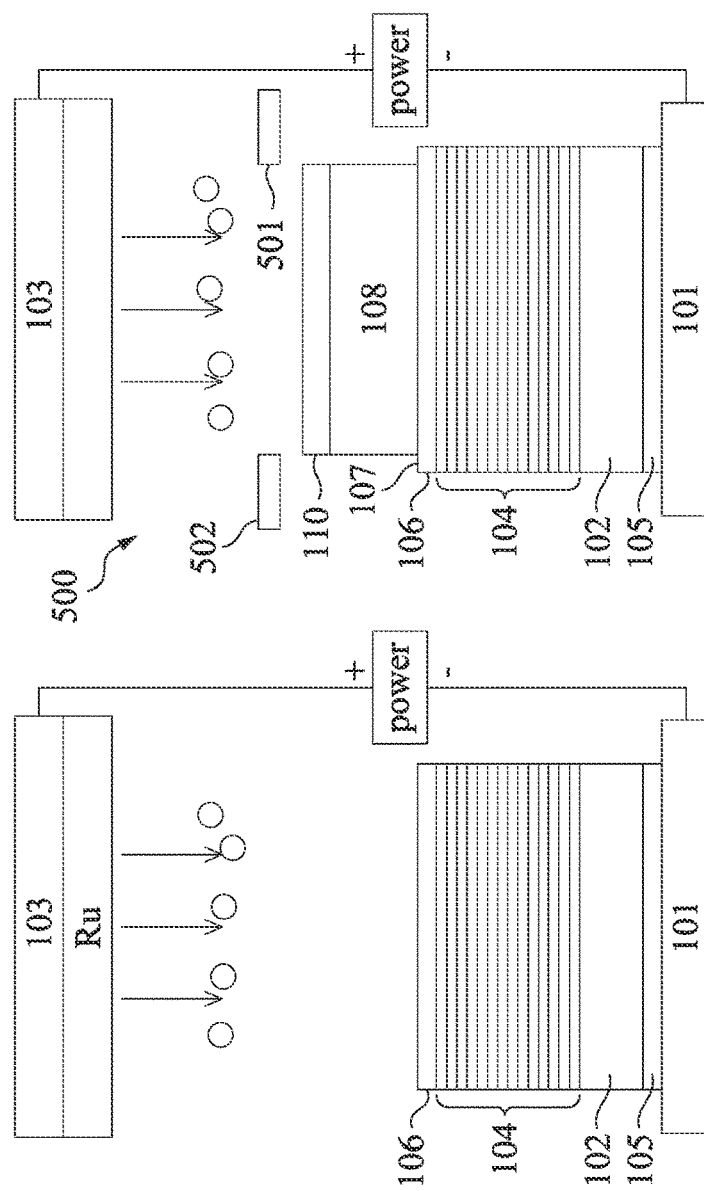
FIGS. 6A, 6B, and 6C illustrate operations in manufacturing an extreme ultraviolet (EUV) reflective mask blank of FIG. 5C, according to embodiments of the disclosure.

FIGS. 6A, 6B, and 6C illustrate operations in manufacturing an extreme ultraviolet (EUV) reflective mask blank 500 used in a lithography exposing tool (e.g., an extreme ultraviolet (EUV) lithography exposing tool), according to embodiments of the disclosure. The operations illustrated in FIGS. 6A, 6B, and 6C are similar in some respects to operations illustrated in FIGS. 5A, 5B, and 5C, and therefore may be best understood with reference thereto where like numerals designate like components not described again in detail. As illustrated, in FIG. 6A, the reflective multilayer (RML) 104 is formed on the substrate 102 using ion beam deposition. The backside coating layer 105 is formed on the backside surface of the substrate 102 opposite to the front surface. Referring to FIG. 6B, the capping layer 106 is formed on the reflective multilayer 104 using a sputtering process, as discussed above. Each of the substrate 102, the reflective multilayer 104, the capping layer 106, and the backside coating layer 105 has a size (length×breadth) that ranges between 150 cm to 152 cm. In some embodiments, each of the substrate 102, the reflective multilayer 104, the capping layer 106, and the backside coating layer 105 has a size (length×breadth) of 152 cm×152 cm or 150 cm×150 cm.

Prior to forming the absorber layer 108 and the hard mask layer 110, the shielding plate 502 is positioned over the assembly including the substrate 102, the reflective multilayer 104, the capping layer 106, and the backside coating layer 105.

Referring to FIG. 6C, the absorber layer 108 is formed on the capping layer 106, and the hard mask layer 110 is formed on the absorber layer 108. The absorber layer 108 and the hard mask layer 110 are each formed by sputtering. The shielding plate 502 is sized or shaped (or otherwise configured) such that the absorber layer 108 and the hard mask layer 110 are formed having length or width dimensions smaller than each of the substrate 102, the reflective multilayer 104, the capping layer 106, and the backside coating layer 105. In some embodiments, the opening 501 of the shielding plate 502 is sized such that the absorber layer 108 and the hard mask layer 110 are formed having dimensions 148×148 cm. In other embodiments, the opening 501 of the shielding plate 502 is sized such that the absorber layer 108 and the hard mask layer 110 are formed having dimensions 146 cm×146 cm. In still other embodiments, the opening 501 of the shielding plate 502 is sized such that the absorber layer 108 and the hard mask layer 110 are formed having dimensions 147×147 cm. As illustrated, the absorber layer 108 and the hard mask layer 110 exposes the peripheral portions of the capping layer 106. In some embodiments, an entire periphery of the capping layer 106 is exposed. In an alternative embodiment, a portion of the peripheral region 107 is exposed while the remaining peripheral region 107 of the capping layer 106 is covered with the absorber layer 108.

In some other embodiments, a protection layer is formed over the substrate prior to depositing the reflective multilayer (RML). As discussed elsewhere in this document, the protection layer protects the substrate during EUV exposures, in instances where layers on the substrate are removed. In the absence of the protection layer, $SiO_2$ particles from the substrate are released during EUV exposure. Secondly, the protection layer functions as a conductive layer and provides for a conductive path to the grounding pin for reducing the secondary electrons generated during e-beam lithography.

FIGS. 7A, 7B, 7C, and 7D illustrate operations in manufacturing an extreme ultraviolet (EUV) reflective mask blank 700 including a protection layer 701, according to embodiments of the disclosure. The mask blank 700 is further patterned for fabricating semiconductor devices using a lithography exposure tool (e.g., an extreme ultraviolet (EUV) lithography exposing tool). The mask blank 700 is similar in some respects to the mask blank 500 in FIGS. 5A-5C, and therefore may be best understood with reference thereto where like numerals designate like components not described again in detail. The operations illustrated in FIGS. 7A, 7B, 7C, and 7D are similar in some respects to operations illustrated in FIGS. 5A, 5B, and 5C, and FIGS. 6A, 6B, and 6C, and therefore may be best understood with reference thereto where like numerals designate like components not described again in detail. As illustrated in FIG. 7A, the mask blank 700 includes a protection layer 701 formed on the substrate 102. In some embodiments, the protection layer 701 is made of ruthenium Ru (or a Ru alloy) that is deposited using sputtering. The thickness of the protection layer 701 ranges between about 2 nm and about 5 nm in some embodiments. The protection layer 701 is formed having dimensions (length×breadth) ranging between 150 cm to 152 cm. In some embodiments, the protection layer 701 has dimensions (length×breadth) of 152 cm×152 cm or 150 cm×150 cm, similar to the dimensions of the substrate 102.

As illustrated, in FIG. 7B, the reflective multilayer (RML) 104 deposited on the protection layer 701 using ion beam sputtering or other methods. The backside coating layer 105 is deposited on the backside surface of the substrate 102 opposite to the front surface.

Referring to FIG. 7C, the capping layer 106 is deposited on the reflective multilayer 104 by ion beam sputtering. In other embodiments, chemical vapor deposition (CVD), or physical vapor deposition (PVD) including sputtering is used. Each of the substrate 102, the protection layer 701, the reflective multilayer 104, the capping layer 106, and the backside coating layer 105 has dimension (length×breadth) ranging between 150 cm to 152 cm. In some embodiments, each of the substrate 102, the protection layer 701, the reflective multilayer 104, the capping layer 106, and the backside coating layer 105 has dimension (length×breadth) of 152 cm×152 cm or 150 cm×150 cm.

Referring to FIG. 7D, the absorber layer 108 is formed on the capping layer 106, and the hard mask layer 110 is formed on the absorber layer 108. The absorber layer 108 and the hard mask layer 110 are each formed by ion beam sputtering in some embodiments. Prior to forming the absorber layer 108 and the hard mask layer 110, the shielding plate 502 is positioned over the assembly including the substrate 102, the protection layer 701, the reflective multilayer 104, the capping layer 106, and the backside coating layer 105.

The opening 501 of the shielding plate 502 is sized or shaped (or otherwise configured) such that the absorber layer 108 and the hard mask layer 110 are formed having length or width dimensions smaller than each of the substrate 102, the protection layer 701, the reflective multilayer 104, the capping layer 106, and the backside coating layer 105.

In some embodiments, the opening 501 of the shielding plate 502 is sized such that the absorber layer 108 and the hard mask layer 110 are formed having dimensions 148×148 cm. In other embodiments, the opening of the shielding plate 502 is sized such that the absorber layer 108 and the hard mask layer 110 are formed having dimensions 146 cm×146 cm. In still other embodiments, the shielding plate 502 is sized such that the absorber layer 108 and the hard mask layer 110 are formed having dimensions 147×147 cm. As illustrated, the absorber layer 108 and the hard mask layer 110 expose portions of the capping layer 106. In some embodiments, an entire periphery of the capping layer 106 is exposed. In an alternative embodiment, a portion of the peripheral region 107 is exposed while the remaining peripheral region 107 of the capping layer 106 is covered with the absorber layer 108.

Figure 8:
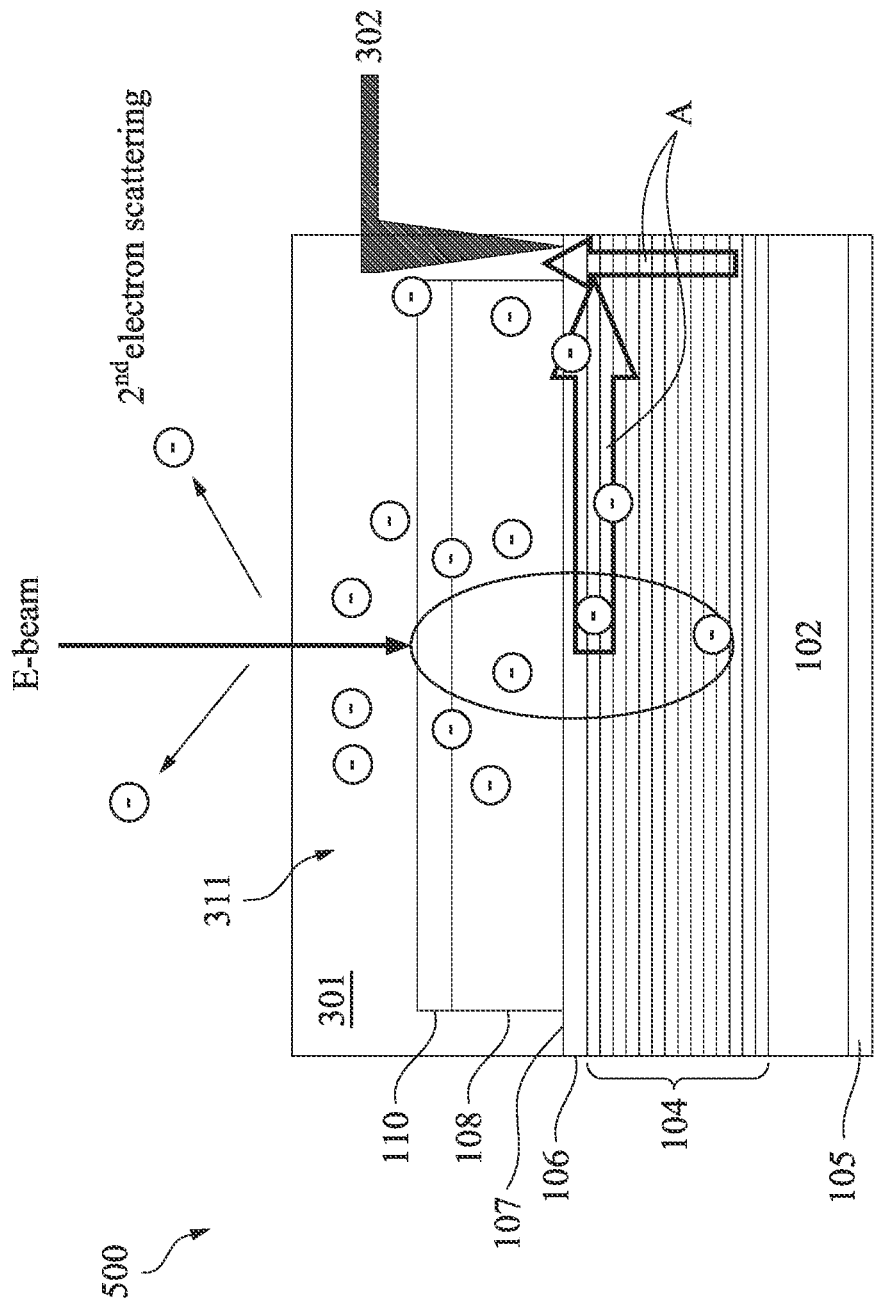
FIG. 8 schematically illustrates the electron-beam (e-beam) lithography process performed on the mask blank of FIG. 5C.

FIG. 8 schematically illustrates the electron-beam (e-beam) lithography process performed on mask blank 500 and the secondary electrons 311 generated as a result. The grounding pin 302 is contacted with the capping layer 106 of the mask blank 100. As shown in FIG. 8, at the periphery of the mask blank 500, the upper surface of the capping layer 106 is exposed. The grounding pin 302 is contacted with the capping layer 106 to discharge the secondary electrons 311 in the mask blank 500, thereby reducing the surface voltage. In some embodiments, the grounding pin 302 is contacted through photoresist layer 301. The flow of the secondary electrons 311 to the grounding pin 302 via the capping layer 106 is indicated by the arrows A. Because the capping layer 106 is a relatively good conductor, the surface voltage is reduced more efficiently relative to the configuration in FIG. 3.

Figure 9:
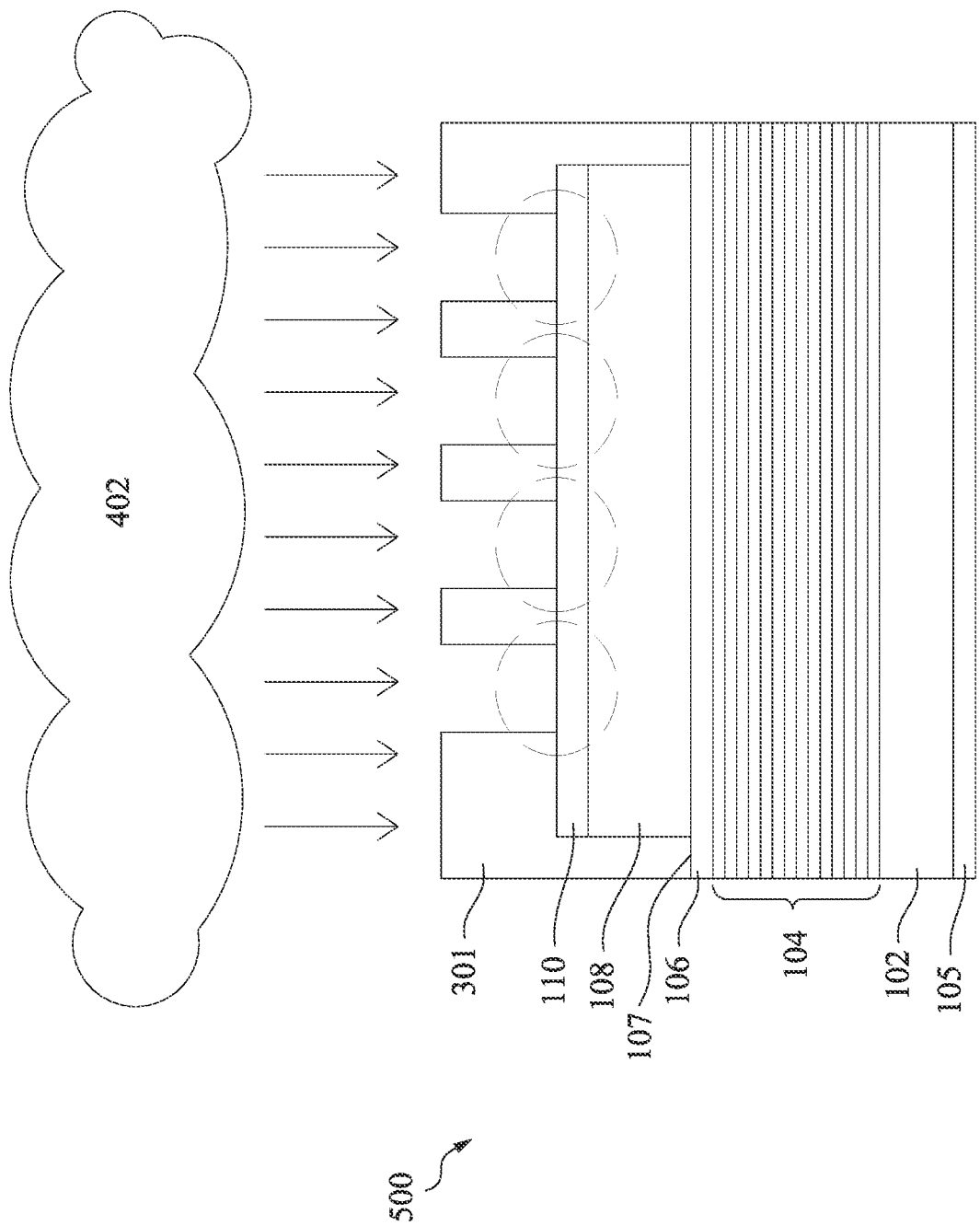
FIG. 9 schematically illustrates a plasma etching process including the mask blank of FIG. 5C.

FIG. 9 schematically illustrates a plasma etching process including the mask blank 500. As illustrated, the photoresist layer 301 covers the sidewalls of the absorber layer 108 and the hard mask layer 110, and the sidewalls are thus not exposed to the plasma 402. As a result, there is a more uniform voltage distribution in the absorber layer 108 and the hard mask layer 110, and this results in improved critical dimension (CD) uniformity.

It should be noted that, although FIGS. 8 and 9 illustrate electron-beam (e-beam) lithography process and plasma etching process, respectively, performed on mask blank 500, embodiments are not limited in this regard and are equally applicable to mask blank 700.

FIGS. 10A-10H illustrates operations for manufacturing an extreme ultraviolet (EUV) reflective mask 1000 (see, FIG. 10H) for fabricating semiconductor devices using a mask blank 500 according to embodiments disclosed. It is understood that additional operations can be provided before, during, and after processes shown by FIGS. 10A-10H, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

In FIG. 10A, a photoresist layer 301 is deposited on the mask blank 500 covering the upper surfaces of the hard mask layer 110 and the capping layer 106, and covering the sidewalls of the absorber layer 108. As illustrated in FIG. 10B, the photoresist layer 301 is patterned using electron-beam lithography. During the electron-beam lithography, a grounding pin 302 is contacted with the capping layer 106 to reduce the secondary electrons generated due to the electron-beam (e-beam) lithography process.

In FIG. 10C, the photoresist layer 301 is developed to expose patterns in the photoresist layer 301 formed by the electron-beam (e-beam) lithography process. In FIG. 10D, portions of the hard mask layer 110 exposed by the patterned photoresist layer 301 are etched, thereby forming openings 303 in the hard mask layer 110 that expose portions of the absorber layer 108. The remaining photoresist layer 301 is removed using a suitable stripping or plasma ashing operation. In other embodiments, a suitable solvent is used to remove the photoresist layer 301. In some other embodiments, the photoresist layer 301 is removed by an oxygen plasma ashing operation.

Figure 10E:
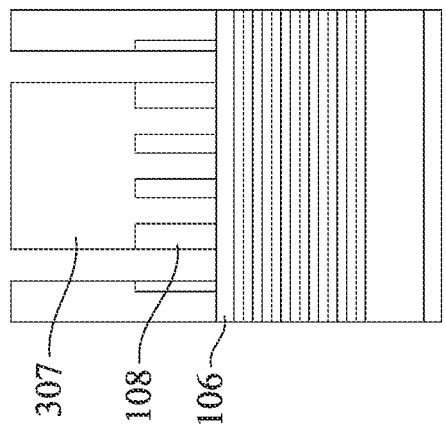

In FIG. 10E, an etching operation is performed to remove portions of the absorber layer 108 exposed by the openings 303 in the hard mask layer 110. The etching operation forms openings 305 in the absorber layer 108 that expose surface of the capping layer 106. The hard mask layer 110 is then stripped in some embodiments.

Figure 10F:
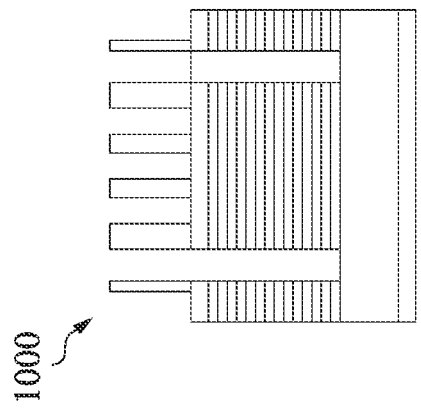

After or before the circuit pattern are formed in the absorber layer 108, a black border pattern surrounding the circuit patterns is formed. In FIG. 10F, a second photoresist layer 307 is deposited over the absorber layer 108 and is patterned to expose portions of the absorber layer 108 remaining after the previous etching operation. For example, as illustrated, outer portions of the absorber layer 108 remaining after the previous etching operation are exposed through the absorber layer 108, while portions of the absorber layer 108 between the outer portions are covered by the second photoresist layer 307.

Figure 10G:
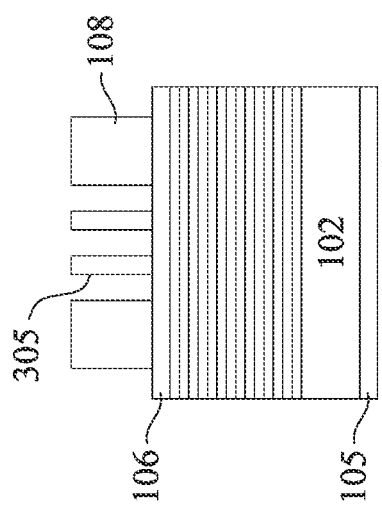
Figure 10H:
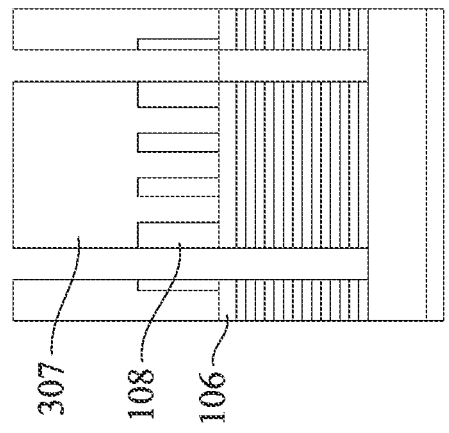
Figure 11B:
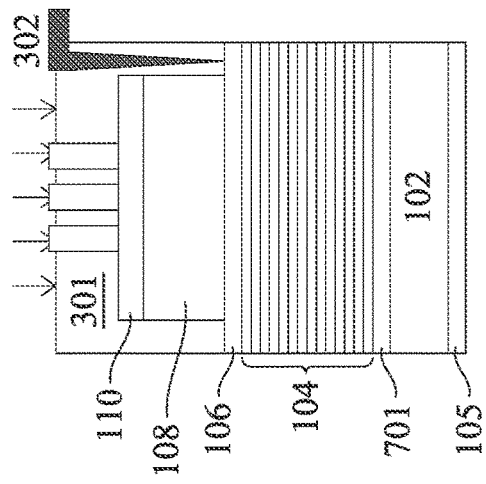
FIGS. 11A, 11B, 11C, 11D, 11E, 11F, 11G, and 11H illustrate operations for manufacturing an extreme ultraviolet (EUV) reflective mask for fabricating semiconductor devices using the mask blank of FIG. 7D, according to embodiments disclosed.
Figure 11D:
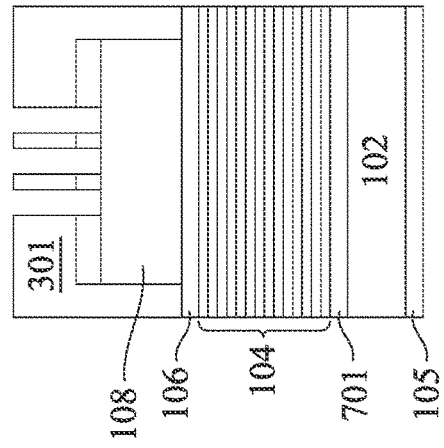
Figure 11A:
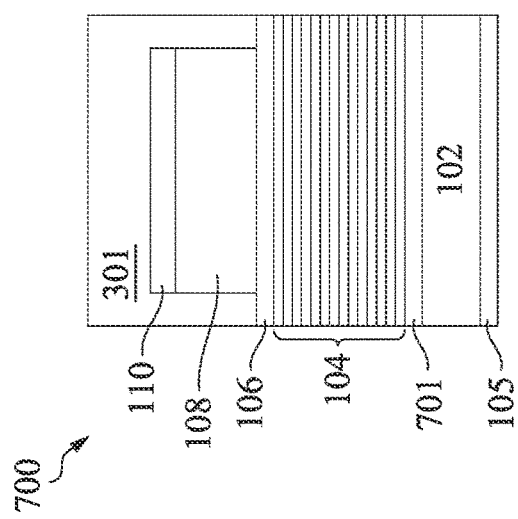
Figure 11C:
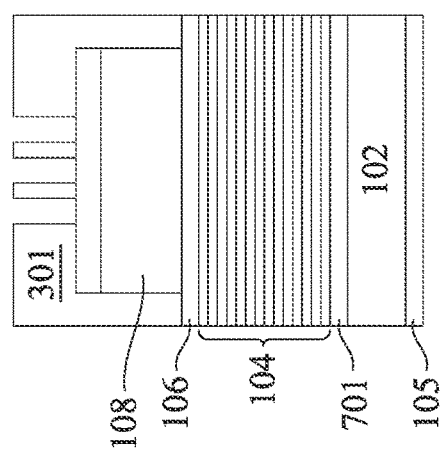
Figure 11E:
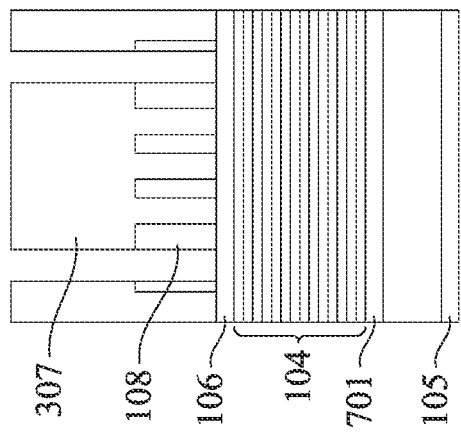
Figure 11F:
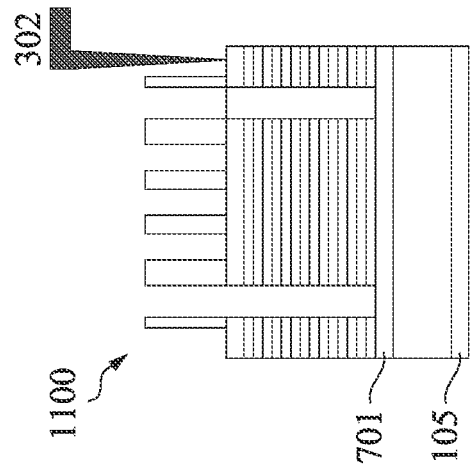
Figure 11G:
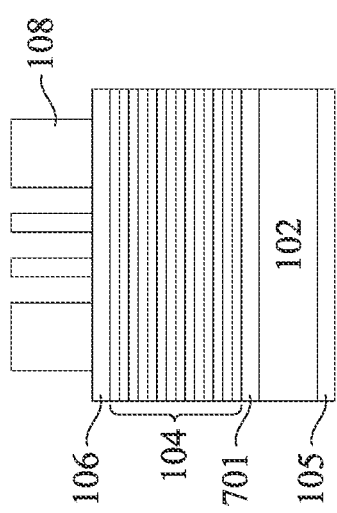
Figure 11H:
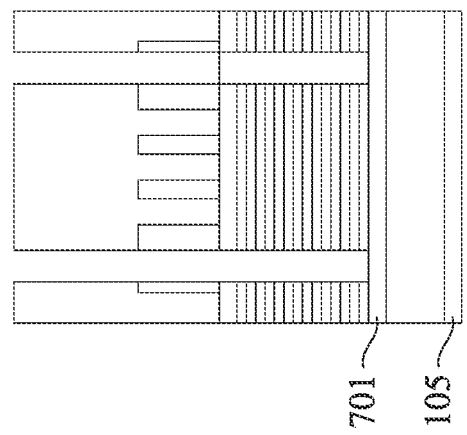

In FIG. 10G, using the pattern in the second photoresist layer 307, the absorber layer 108, the capping layer 106, and the reflective multilayer 104 are etched to expose portions of the substrate 102, thereby forming the black border pattern. In FIG. 10H, the second photoresist layer 307 is stripped using known techniques and the mask 1000 is obtained. In some embodiments, the mask 1000 is subjected to an inspection and a repair process.

FIGS. 11A-11H illustrates operations for manufacturing an extreme ultraviolet (EUV) reflective mask 1100 for fabricating semiconductor devices using blank mask blank 700 according to embodiments disclosed. It is understood that additional operations can be provided before, during, and after processes shown by FIGS. 11A-11H, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The operations in FIGS. 11A-11H are similar in some respects to the operations in FIGS. 10A-10H, and therefore may be best understood with reference thereto where like numerals designate like components not described again in detail.

The protection layer 701 protects the substrate 102 when exposed to radiation (e.g., EUV radiation). In the absence of the protection layer 701, portions of the substrate 102 are exposed. This causes $SiO_2$ particles from the substrate 102 to be released during exposure. In addition, the protection layer 701 (including ruthenium Ru (or a Ru alloy)) functions as a conductive layer and provides a conductive path to the grounding pin 302 during e-beam defect inspection. The grounding pin 302 is contacted with the capping layer 106 to reduce the secondary electrons generated during the e-beam lithography process. Since the substrate 102 is a poor electric conductor, secondary electrons in the mask 1100 cannot be effectively reduced via the grounding pin. The protection layer 701 provides a conductive path for reducing the secondary electrons in the mask 1100.

It will be understood that not all advantages have been necessarily discussed herein, no particular advantage is required for all embodiments or examples, and other embodiments or examples may offer different advantages.

An embodiment of the disclosure is a reflective mask blank that includes a substrate, a reflective multilayer (RML) disposed on the substrate, a capping layer disposed on the reflective multilayer, and an absorber layer disposed on the capping layer. The absorber layer has length or width dimensions in a plan view smaller than the capping layer, and part of the capping layer is exposed from the absorber layer. In some embodiments, a hard mask layer formed on the absorber layer. The hard mask layer has length and width dimensions same as the absorber layer and part of the capping layer is exposed by the hard mask layer. In some embodiments, dimensions of the absorber layer and the hard mask layer are between 146 cm to 148 cm. In some embodiments, dimensions of each of the substrate, the RML, and the capping layer range between 150 cm to 152 cm. In some embodiments, the capping layer includes ruthenium or an alloy of ruthenium. In some embodiments, the alloy of ruthenium is an alloy of ruthenium and at least one selected from the group consisting of Po, Hg, Os, Rh, Pd, Jr, Nb, Pt, Zr, V, Mn, and Ta. In some embodiments, a protection layer disposed on the substrate and between the substrate and the RML.

Another embodiment of the disclosure is a method of manufacturing a mask blank including forming a reflective multilayer (RML) on a substrate, forming a capping layer on the RML, and forming an absorber layer on the capping layer, the absorber layer having length or width dimensions in a plan view smaller than the capping layer, and the absorber layer exposing part of the capping layer. In some embodiments, the method further includes forming a hard mask layer on the absorber layer. The hard mask layer has length and width dimensions same as the absorber layer and the hard mask layer exposes part of the capping layer. In some embodiments, the hard mask layer exposes a same part of the capping layer that is exposed by the absorber layer. In some embodiments, dimensions of the absorber layer and the hard mask layer range between 146 cm to 148 cm. In some embodiments, dimensions of each of the substrate, the RML, and the capping layer range between 150 cm to 152 cm. In some embodiments, the capping layer includes ruthenium or an alloy of ruthenium. In some embodiments, the alloy of ruthenium is an alloy of ruthenium and at least one selected from the group consisting of Po, Hg, Os, Rh, Pd, Jr, Nb, Pt, Zr, V, Mn, and Ta. In some embodiments, the method further comprises forming a protection layer on the substrate and between the substrate and the RML.

Still other embodiment of the disclosure is a method of manufacturing a mask blank includes forming a reflective multilayer (RML) on a substrate, forming a capping layer on the RML, positioning a shielding plate over the capping layer, the shielding plate including an opening, and forming an absorber layer on the capping layer through the opening. The opening is sized such that the absorber layer formed in the capping layer has having length or width dimensions in a plan view smaller than the capping layer, and the absorber layer exposes part of the capping layer. In some embodiments, the method further includes forming a hard mask layer on the absorber layer through the opening. The hard mask layer has length and width dimensions same as the absorber layer and the hard mask layer exposes part of the capping layer. In some embodiments, forming the hard mask layer includes forming the hard mask layer on the absorber layer such that the hard mask layer exposes a same part of the capping layer that is exposed by the absorber layer. In some embodiments, the method further includes patterning the mask blank to obtain a reflective photomask for fabricating a semiconductor circuit. In some embodiments, the method further includes forming a protection layer on the substrate and between the substrate and the RML.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a photomask using a mask blank, comprising:
   forming a reflective multilayer (RML) on a substrate;
   forming a capping layer on the RML;
   forming an absorber layer on the capping layer, the absorber layer having length or width dimensions in a cross-sectional view smaller than the capping layer, and the absorber layer exposing part of the capping layer;
   forming a hard mask layer on the absorber layer, wherein the hard mask layer has length and width dimensions same as the absorber layer and the hard mask layer exposes part of the capping layer;
   depositing a first photoresist layer on upper surfaces of the hard mask layer and the capping layer, and that covers sidewalls of the absorber layer;
   patterning the first photoresist layer using electron-beam (e-beam) lithography;
   reducing secondary electrons generated in the mask blank during the e-beam lithography process;
   developing the first photoresist layer to expose patterns in the first photoresist layer formed by the e-beam lithography process;
   etching portions of the hard mask layer exposed by the patterned first photoresist layer to form openings in the hard mask layer; and
   performing a first etching operation to etch portions of the absorber layer exposed through the openings in the hard mask layer to form openings in the absorber layer that expose the upper surface of the capping layer.

2. The method of claim 1, further comprising:
   prior to the first etching operation, removing the first photoresist layer remaining after developing the first photoresist layer.

3. The method of claim 1, further comprising:
   reducing the secondary electrons generated in the mask blank by contacting a grounding pin with the capping layer.

4. The method of claim 1, further comprising:
   removing the hard mask layer after forming the openings in the absorber layer.

5. The method of claim 1, further comprising:
   depositing a second photoresist layer over the absorber layer;
   patterning the second photoresist layer to expose portions of the absorber layer remaining after the first etching operation;
   using the patterned second photoresist layer, performing the second etching operation to etch the absorber layer, the capping layer, and the reflective multilayer to expose portions of the substrate; and
   removing the second photoresist layer.

6. The method of claim 5, wherein the second photoresist layer occupies the openings in the absorber layer and covers outer portions of the absorber layer remaining after the first etching operation.

7. The method of claim 1, wherein the hard mask layer exposes a same part of the capping layer that is exposed by the absorber layer.

8. The method of claim 1, wherein dimensions of the absorber layer and the hard mask layer range between 146 cm to 148 cm.

9. The method of claim 1, wherein dimensions of each of the substrate, the RML, and the capping layer range between 150 cm to 152 cm.

10. The method of claim 1, wherein the capping layer includes ruthenium or an alloy of ruthenium.

11. The method of claim 10, wherein the alloy of ruthenium is an alloy of ruthenium and at least one selected from the group consisting of Po, Hg, Os, Rh, Pd, Ir, Nb, Pt, Zr, V, Mn, and Ta.

12. The method of claim 1, further comprising:
forming a protection layer on the substrate; and
forming the reflective multilayer (RML) on the protection layer.

13. A method of manufacturing a photomask using a mask blank, comprising:
forming a reflective multilayer (RML) on a substrate;
forming a capping layer on the RML;
positioning a shielding plate over the capping layer, the shielding plate including an opening; and
forming an absorber layer on the capping layer through the opening, wherein the opening is sized such that the absorber layer is formed in the capping layer having length or width dimensions in a plan view smaller than length or width dimensions of the capping layer, and an upper surface of capping layer along a periphery of the capping layer is exposed by the absorber layer
forming a hard mask layer on the absorber layer, wherein the hard mask layer has length and width dimensions same as length and width dimensions of the absorber layer and the hard mask layer and the absorber layer expose a same part of the capping layer;
depositing a first photoresist layer on the upper surfaces of the hard mask layer and the capping layer, and that covers sidewalls of the absorber layer;
patterning the first photoresist layer using electron-beam (e-beam) lithography;
reducing secondary electrons generated in the mask blank during the e-beam lithography process;
developing the first photoresist layer to expose patterns in the first photoresist layer formed by the e-beam lithography process;
etching portions of the hard mask layer exposed by the patterned first photoresist layer to form openings in the hard mask layer; and
performing a first etching operation to etch portions of the absorber layer exposed through the openings in the hard mask layer to form openings in the absorber layer that expose the upper surface of the capping layer.

14. The method of claim 13, wherein reducing the secondary electrons includes reducing the secondary electrons via the capping layer of the mask blank.

15. The method of claim 13, further comprising:
prior to the first etching operation, removing the first photoresist layer remaining after developing the first photoresist layer; and
removing the hard mask layer after forming the openings in the absorber layer.

16. The method of claim 13, further comprising:
depositing a second photoresist layer over the absorber layer and the capping layer;
patterning the second photoresist layer to expose portions of the absorber layer remaining after the first etching operation;
using the patterned second photoresist layer, performing a second etching operation to etch portions of the absorber layer exposed and portions of the capping layer and the reflective multilayer underneath the etched absorber layer to form a black border pattern that surrounds the portions of the absorber layer etched in the first etching operation; and
removing the second photoresist layer.

17. A photomask, comprising:
a substrate;
a reflective multilayer (RML) disposed on the substrate;
a capping layer disposed on the reflective multilayer; and
an absorber layer disposed on the capping layer; and
a black border pattern surrounding patterns formed in the absorber layer, wherein
the absorber layer has length or width dimensions in a cross-sectional view smaller than the capping layer,
peripheral portions of the capping layer surrounding the absorber layer are exposed, and
the black border pattern is defined by the absorber layer, the capping layer, and the RML.

18. The photomask of claim 17, further comprising:
a protection layer disposed on the substrate, wherein the RML is disposed on the protection layer, and
the black border pattern exposes portions of the protection layer.

19. The photomask of claim 17, wherein dimensions of the absorber layer are between 146 cm to 148 cm.

20. The photomask of claim 17, wherein dimensions of each of the substrate, the RML, and the capping layer are between 150 cm to 152 cm.

* * * * *